United States Patent [19]
Wicker et al.

[11] Patent Number: 6,129,808
[45] Date of Patent: Oct. 10, 2000

[54] LOW CONTAMINATION HIGH DENSITY PLASMA ETCH CHAMBERS AND METHODS FOR MAKING THE SAME

[75] Inventors: Thomas E. Wicker, Reno, Nev.; Robert A. Maraschin, Cupertino; William S. Kennedy, Redwood Shores, both of Calif.

[73] Assignee: LAM Research Corporation, Fremont, Calif.

[21] Appl. No.: 09/161,074

[22] Filed: Sep. 25, 1998

Related U.S. Application Data

[63] Continuation-in-part of application No. 09/050,902, Mar. 31, 1998, abandoned.

[51] Int. Cl.$^7$ .................................................. H05H 1/00
[52] U.S. Cl. .................. 156/345; 118/723 R; 118/723 E
[58] Field of Search ........................ 156/345; 118/723 R, 118/723 E, 728; 204/298.02, 298.31, 298.15, 298.34

[56] References Cited

U.S. PATENT DOCUMENTS

| | | | |
|---|---|---|---|
| 4,399,546 | 8/1983 | Phillips | 373/115 |
| 4,981,551 | 1/1991 | Palmour | 156/643 |
| 5,367,139 | 11/1994 | Bennett et al. | 219/121.59 |
| 5,444,217 | 8/1995 | Moore et al. | 219/405 |
| 5,460,684 | 10/1995 | Saeki et al. | 156/345 |
| 5,494,523 | 2/1996 | Steger et al. | 118/723 |
| 5,538,230 | 7/1996 | Sibley | 269/296 |
| 5,569,356 | 10/1996 | Lenz et al. | 156/643.1 |
| 5,584,936 | 12/1996 | Pickering et al. | 118/728 |
| 5,641,375 | 6/1997 | Nitescu et al. | 156/345 |
| 5,725,675 | 3/1998 | Fong et al. | 118/723 E |
| 5,788,799 | 8/1998 | Steger et al. | |
| 5,904,800 | 5/1999 | Mautz | 156/345 |

FOREIGN PATENT DOCUMENTS

| | | | |
|---|---|---|---|
| 63273 | 10/1982 | European Pat. Off. | H01J 37/32 |
| 246238 | 9/1997 | Japan | H01L 21/3065 |
| 98/14980 | 4/1998 | WIPO . | |
| 99/50886 | 10/1999 | WIPO . | |

Primary Examiner—Thi Dang
Attorney, Agent, or Firm—Burns, Doane, Swecker & Mathis, L.L.P.

[57] ABSTRACT

A high density plasma processing chamber including an electrostatic chuck for holding a wafer, and consumable parts that are highly etch resistant, less susceptible to generating contamination and temperature controllable is disclosed. The consumable parts include a chamber liner having a lower support section and a wall that is configured to surround the electrostatic chuck. The consumable parts also include a liner support structure having a lower extension, a flexible wall, and an upper extension. The flexible wall is configured to surround an external surface of the wall of the chamber liner, and the liner support flexible wall is spaced apart from the wall of the chamber liner. The lower extension of the liner support is however, configured to be in direct thermal contact with the lower support section of the chamber liner. Additionally, a baffle ring is part of the consumable parts, and is configured to be assembled with and in thermal contact with the chamber liner and the liner support. A heater is capable of being thermally connected to the liner support for thermally conducting a temperature from the liner support to the chamber liner and the baffle ring. In a most preferred embodiment, the chamber liner and the baffle ring are made from materials that are innocuous to materials on the wafer being etched. In this manner, once these materials are exposed to the energy of the high density plasma sputtering, volatile products will be produced that are substantially similar to volatile etch products produced during the etching of surface layers of the wafer. These volatile products can then be removed from the chamber.

38 Claims, 9 Drawing Sheets

LOW CONTAMINATION HIGH DENSITY PLASMA ETCH CHAMBERS AND METHODS FOR MAKING THE SAME

CROSS REFERENCE TO RELATED APPLICATIONS

This application claims priority under 35 U.S.C § 120 as a continuation-in-part of pending U.S. patent application No. 09/050,902, filed Mar. 31, 1998, and entitled "Contamination Controlling Method and Apparatus for Plasma Processing Chamber now abandoned. " The contents of this pending application are incorporated herein by reference for all purposes.

BACKGROUND OF THE INVENTION

1. Field of the Invention

The present invention relates generally to the fabrication of semiconductor wafers, and, more particularly, to high density plasma etching chambers having lining materials that reduce particle and metallic contamination during processing, and associated chamber lining structures.

2. Description of the Related Art

As integrated circuit devices continue to shrink in both their physical size and their operating voltages, their associated manufacturing yields become more susceptible to particle and metallic impurity contamination. Consequently, fabricating integrated circuit devices having smaller physical sizes requires that the level of particulate and metal contamination be less than previously considered to be acceptable.

In general, the manufacturing of the integrated circuit devices (in the form of wafers) includes the use of plasma etching chambers, which are capable of etching selected layers defined by a photoresist mask. The processing chambers are configured to receive processing gases (i.e., etch chemistries) while a radio frequency (RF) power is applied to one or more electrodes of the processing chamber. The pressure inside the processing chamber is also controlled for the particular process. Upon applying the desired RF power to the electrode(s), the process gases in the chamber are activated such that a plasma is created. The plasma is thus configured to perform the desired etching of the selected layers of the semiconductor wafer.

Typically, a processing chamber that is used for etching materials such as silicon oxides requires relatively high energies to achieve the desired etch result, compared to other films etched during fabrication. Such silicon oxides include, for example, thermally grown silicon dioxide ($SiO_2$), TEOS, PSG, BPSG, USG (undoped spin-on-glass), LTO, etc. The need for high energies stems from the need to bombard and break the strong bonds of the silicon oxide films and drive chemical reactions to form volatile etch products. These chambers are therefore referred to as "high density oxide etch chambers," that are capable of producing high plasma densities in order to provide a high ion flux to the wafer and achieve high etch rates at low gas pressures.

While high density oxide etch chambers work well in etching the desired wafer surfaces, the internal surfaces of the etch chamber are also subjected to the high ion power. Therefore, material from the internal surfaces of the etch chamber is removed as a result of the ion bombardment by either physical sputtering or chemical sputtering, depending on the composition of the material and the composition of the etch gas.

Recognizing that the internal surfaces of the etch chamber are exposed to the plasma in high density oxide chambers, chambers are now designed to permit the use of simple lining parts, such as, disks, rings, and cylinders. Because these parts are configured to confine the plasma over the wafer being processed, these parts are continuously exposed and attacked by the processing plasma energies. Due to this exposure, these parts ultimately erode or accumulate polymer buildup, requiring replacement or thorough cleaning. Eventually, all parts wear out to the point that they are no longer usable. These parts are hence referred to as "consumables." Therefore, if the part's lifetime is short, then the cost of the consumable is high (i.e., part cost/part lifetime).

Because these parts are consumables, it is desirable to have surfaces that are resistant to the plasma energies, which will therefore reduce the cost of the consumable. Prior art attempts to reduce the cost of the consumable have included manufacturing these parts from aluminum oxide ($Al_2O_3$) and quartz materials. Although these materials are somewhat resistant to the plasma energies, in high density oxide etch chambers, the high ion bombardment by the plasma has the down side of producing levels of contamination (e.g., particle contamination and metallic impurity contamination) that are less than acceptable. For example, if the surface of the consumable part is aluminum oxide (i.e., alumina), when the plasma bombards the surfaces, aluminum will be released and then will mix in with the plasma that lies above the wafer. Some of this aluminum becomes embedded in an organic polymer that is deposited on the wafer during etching and on the surfaces of the consumable parts (i.e., chamber liners, covers, and the like). When this happens, the polymer on the surface of the consumable parts may not be able to be completely cleaned during a conventional in-situ plasma clean or "ash" step. Thus, a friable, flaking film or powdery coating that includes C, Al, O, and F is left behind after the in-situ plasma clean, and therefore results in high particle counts. The aluminum deposited in structures being etched and the films on the silicon wafer can cause degradation of devices subsequently formed, for example, by increasing leakage current in DRAM cells.

As mentioned above, quartz is also used as the material of the interior surfaces of the consumable parts. However, quartz surfaces have been found to be an unfortunate source of particles due to the low thermal conductivity of quartz and the high etch rates in high density plasmas used to etch oxides. Additionally, low thermal conductivity quartz makes surface temperature control of these parts very difficult. This results in large temperature cycling and flaking of the etch polymer deposited on the surface of the consumable parts, and therefore causes the unfortunate generation of contaminating particles. A further disadvantage of quartz consumable parts is that the high etch rate in high density oxide etchers tends to cause pitting in the quartz, which then results in spalling of quartz particles.

In view of the foregoing, there is a need for high density plasma processing chambers having consumable parts that are more resistant to erosion and assist in minimizing contamination (e.g., particles and metallic impurities) of the wafer surfaces being processed. There is also a need for consumable parts for use in high density plasma applications, and that are capable of withstanding temperature variations while preventing damage to the consumable parts.

SUMMARY OF THE INVENTION

The present invention fills these needs by providing temperature controlled, low contamination, high etch resistant, plasma confining parts (i.e., consumables) for use in plasma processing chambers. It should be appreciated that the present invention can be implemented in numerous ways, including as a process, an apparatus, a system, a device or a method. Several inventive embodiments of the present invention are described below.

In one embodiment, disclosed is a plasma processing chamber including an electrostatic chuck for holding a wafer, and having consumable parts that are highly etch resistant, less susceptible to generating contamination and can be temperature controlled. The consumable parts include a chamber liner having a lower support section and a wall that is configured to surround the electrostatic chuck. The consumable parts also include a liner support structure having a lower extension, a flexible wall, and an upper extension. The flexible wall is configured to surround an external surface of the wall of the chamber liner, and the liner support flexible wall is spaced apart from the wall of the chamber liner. The lower extension of the liner support is however, configured to be in direct thermal contact with the lower support section of the chamber liner. Additionally, a baffle ring is part of the consumable parts, and is configured to be assembled with and in thermal contact with the chamber liner and the liner support. The baffle ring defines a plasma screen around the electrostatic chuck. A heater is then capable of being thermally connected to the upper extension of the liner support for thermally conducting a temperature from the liner support to the chamber liner and the baffle ring. Also included is an outer support that is thermally connected to a cooling ring that is coupled to a top plate of the chamber. The outer support and the cooling ring are therefore capable of providing precision temperature control to the chamber liner, along with a cast heater. This precision temperature control therefore prevents temperature drifts, which therefore advantageously enable etching a first wafer with about the same temperature conditions as a last wafer.

In a most preferred embodiment, the chamber liner and the baffle ring are made from a material selected from one of a silicon carbide (SiC) material, a silicon nitride ($Si_3N_4$) material, a boron carbide ($B_4C$) material, a boron nitride (BN) material. In this manner, these materials, once exposed to the energy of the plasma sputtering, will produce volatile products that are substantially similar to volatile etch products produced during the etching of surface layers of the wafer.

In another embodiment, a plasma etching chamber having consumable parts is disclosed. The consumable parts include a chamber liner having a lower support section and a cylindrical wall that surrounds a center of the plasma etching chamber. A liner support that is configured to surround the chamber liner. The liner support is thermally connected to the lower support section of the chamber liner. The liner support further includes a plurality of slots that divide the liner support into a plurality of fingers. In a preferred embodiment, the chamber liner is made from a material selected from one of a silicon carbide (SiC) material, a silicon nitride ($Si_3N_4$) material, a boron carbide ($B_4C$) material, and a boron nitride (BN) material, and the liner support is made from an aluminum material.

In yet another embodiment, method for making consumable parts for use in a high density plasma etching chamber is disclosed. The method includes generating a chamber liner from a material selected from one of a silicon carbide (SiC) material, a silicon nitride ($Si_3N_4$) material, a boron carbide ($B_4C$) material, and a boron nitride (BN) material. The chamber liner has a wall that surrounds a plasma region of the chamber and a lower support section. The method then includes generating an aluminum liner support. The liner support having a lower extension, a flexible wall and an upper extension. Then, machining a plurality of slots into the flexible wall and the lower extension of the liner support to enable the liner support to expand under elevated temperatures. The method then proceeds to generating a baffle ring from the material selected from one of the silicon carbide (SiC) material, the silicon nitride ($Si_3N_4$) material, the boron carbide ($B_4C$) material, and the boron nitride (BN) material. Then, machining a plurality of slots into the baffle ring to define a plasma screen. The method then includes connecting the chamber liner, the liner support and the baffle ring together at a thermal conduction interface, such that a good thermal contact exists between the chamber liner, the liner support and baffle ring.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention for temperature controlled, low contamination, high etch resistant, plasma confining parts (i.e., consumables) for use in plasma processing chambers is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

The plasma confining parts of the present invention are in the form of, for example, chamber liners, baffle rings, gas distribution plates, focus rings, liner supports, and other non-electrically driven parts. These parts are preferably configured to be substantially non-contaminating and etch resistant, and their temperature controlled without damaging the parts. The plasma confining parts are preferably made from materials that consist of elements that are innocuous to devices being fabricated on the wafer, such as silicon (Si), carbon (C), nitrogen (N), or oxygen (O). In this manner, when the plasma confining parts are bombarded by ions (i.e., sputtered by the plasma), volatile products that combine with the process gases are produced. These volatile products can then be removed from the chamber using a vacuum pump and will not end up on the wafer causing contamination. Because the plasma confining parts are more resistant to the etch gases, the life of the parts will also be prolonged.

The plasma confining parts of the present invention are therefore made from materials such as, for example, silicon carbide (SiC), silicon nitride ($Si_3N_4$), boron carbide $B_4C$), and boron nitride BN). These materials all have the desirable characteristics of having high etch resistance, non-contaminating elements, and volatile etch products. In a most preferred embodiment, the plasma confining parts (also referred to as consumable parts) are made from solid silicon carbide (SiC), which therefore reduces metal and/or particle contamination of the processed wafer. The SiC used for the baffle ring 132 and liner 130 is preferably electrically conductive so that when it is in contact with the plasma it presents a good ground path for the RF current. Higher resistivity SiC is used for the GDP (ie., 120 of FIG. 1) in order to permit inductive coupling of RF power through it. As mentioned above, the SiC also etches at a slow rate by the plasma making it a cost-effective consumable part.

Moreover, because the SiC is of high purity, wafer contamination resulting from chemical sputtering of the SiC by the plasma can be minimized. Further, the grounded SiC can reduce sputtering of other surfaces in the chamber by causing a reduction in the plasma potential and hence ion bombardment energy to any non-silicon carbide surfaces. The SiC component also provides a very stable plasma potential so that etch results are more repeatable within an individual chamber and from chamber to chamber. For more information on the use of plasma confining parts capable of reducing contamination high density plasma processing, reference may be made to a commonly assigned U.S. Pat. application having application No. 09/050,902, filed on Mar. 31, 1998, and entitled "Contamination Controlling Method and Apparatus For A Plasma Processing Chamber." This application is hereby incorporated by reference. The various embodiments of the present invention will now be described with reference to FIGS. 1 through 8.

Figure 1:
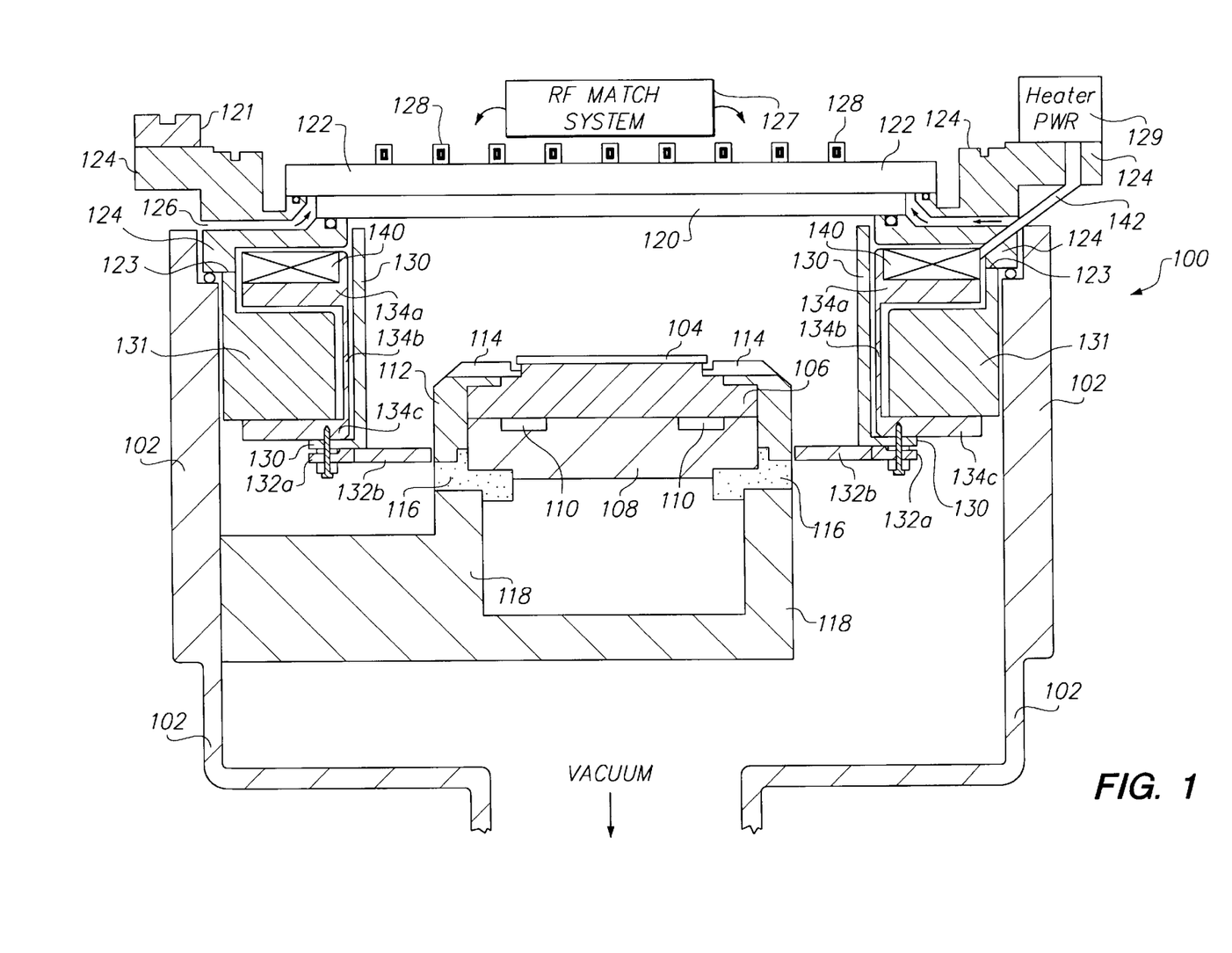
FIG. 1 shows a high density plasma etching chamber in accordance with one embodiment of the present invention.

FIG. 1 shows a high density plasma etching chamber 100 in accordance with one embodiment of the present invention. A chamber housing 102 is shown containing a wafer 104, that may be subjected to a plasma etching operation. In this embodiment, the etching operating is preferably a high density plasma operation that is configured to etch materials such as silicon oxides, that may be formed on the surface of the wafer 104. The high density (e.g., plasmas having a densities between about $10^{11}$–$11^{12}$ ions/cm$^3$) plasma is established in the chamber by ensuring that the chamber is held at a relatively low pressure of below about 80 mTorr, and most preferably between about 1 mTorr and about 40 mTorr. The pressure in the chamber is generally maintained by implementing a suitable vacuum pump at the bottom of the chamber.

The wafer 104 is shown supported over an electrostatic chuck 106. Beneath the electrostatic chuck 106 is a lower electrode 108 which contains a backside cooling ring 110 for controlling the temperature of the electrostatic chuck 106. The electrostatic chuck 106 is confined by a pedestal 112 and a focus ring 114 that surrounds the wafer 104. In one embodiment of the present invention, the pedestal 112 and the focus ring 114 are preferably made from a material selected from a group including: (a) silicon carbide (SiC), (b) silicon nitride ($Si_3N_4$), (c) boron carbide ($B_4C$), or (d) boron nitride (BN). In a most preferred embodiment, $Si_3N_4$ is selected as the material for the pedestal 112 and the focus ring 114.

An insulating alumina ring 116 sits between an aluminum pedestal 118 and the lower electrode 108 and the silicon carbide pedestal 112. A chamber liner 130 is preferably a cylindrical liner which can be attached to a baffle ring 132. The baffle ring 132 generally includes an inner ring 132a that makes good electrical conductive contact as well as good thermal contact with the chamber liner 130. The baffle ring 132 also has an integral array of teeth 132b which will be described in greater detail with reference to FIGS. 2A through 2C.

Above the wafer 104 is a gas distribution plate (GDP) 120 which functions as a showerhead to release the etch gas chemicals into the processing chamber. Above the gas distribution plate 120 sits a ceramic window 122. Above the ceramic window 122 is an RF coil system 120 (i.e., an RF antenna), which is used to supply a top RF power into the reactor chamber 102. The RF coils 120 are preferably cooled via a cooling channel that is integrated at the center of the RF coils 120. In this simplified illustration, a gas feed port 126 is used to feed processing gases into channels that are defined between the ceramic window 122 and the gas distribution plate 120. For more information on process chambers, reference may be made to a TCP 9100™ plasma etching reactor, which is available from LAM Research Corporation, of Fremont, Calif.

An RF impedance matching system 127 is configured to mount over the processing chamber and make suitable contact with the RF coils 122 in order to control the delivery of power as well as other reactor controlling parameters. As mentioned above, the ceramic window 122 is designed to be in contact with the gas distribution plate that mounts within a top plate 124. The top plate 124 defines an interface between atmospheric pressure and a desired vacuum condition within the high density plasma etching chamber 100. As should be apparent to those skilled in the art, the desired pressure interface is established by placing a suitable number of O-rings between interfaces of the chamber housing 102, the top plate 124, the GDP 120, the ceramic window 122, and the RF match system 127.

A liner support 134 is also provided within the high density plasma etching chamber 100 to enable precision control and transfer of a desired temperature to the chamber liner 130 and the baffle ring 132. In this embodiment, the liner support 134 is made of aluminum to facilitate its flexibility and improve its thermal conductivity. The liner support 134 includes an upper extension 134*a*, a flexible wall 134*b*, a lower extension 134*c*, and a liner support extension 134*d*. The lower extension 134*c* is shown assembled in direct thermal contact with the chamber liner 130, and the baffle ring 132. In this embodiment, the flexible wall 134*b* is slightly separated from the chamber liner 130. A heater 140 is capable of being secured in direct thermal contact with the upper extension 134*a* of the liner support 134. To power up and control the heater 140, a power connection 142 is used to couple to a heater power system 129. The liner support is therefore well suited to control a desired temperature that can be thermally transferred to the chamber liner 130 and the baffle ring 132 without causing damage to the (more brittle) chamber liner 130 or baffle ring 132.

Also shown is an outer support 131, which is thermally connected to the lower extension 134*c* of the liner support 134. The outer support is also thermally coupled to the top plate 124, which is designed to receive a cooling ring 121. As will be described in greater detail below with reference to FIGS. 5A and 5B, the outer support 131 is used to achieve precision temperature control of the chamber liner 130 during wafer processing operations (e.g., etching). The precision temperature control provided by the outer support 131 and cooling ring 121 will therefore advantageously assist in preventing the chamber liner temperature from gradually drifting upwards (due to the plasma energies) faster than the liner's ability to radiate the heat to its surroundings.

As mentioned above, the chamber liner 130 and the baffle ring 132 are preferably made of a pure silicon carbide material. In addition, the gas distribution plate 120, the focus ring 114 and the pedestal 112 are also made of a pure silicon nitride or carbide materials, or at least silicon carbide coated. In this manner, substantially all of the surfaces that confine the high density plasma will be pure silicon carbide, or coated silicon carbide. In a broad context, other materials that consist only of elements that are innocuous to devices on the wafer being processed, such as silicon (Si), carbon (C), nitrogen (N), or oxygen, which form volatile etch products with the etch gases, may be used. In this manner, the volatile products produced when the internal surfaces that confine the plasma are bombarded, will mix with the excess etch gases that are commonly removed from the chamber (using a vacuum pump or the like). Because the products produced when the plasma bombards the internal surfaces of the chamber (i.e., the consumable parts) are volatile, these products will not end up on the surface of the wafer causing contamination, nor end up embedded in the polymer deposited on the consumable parts.

Figure 2A:
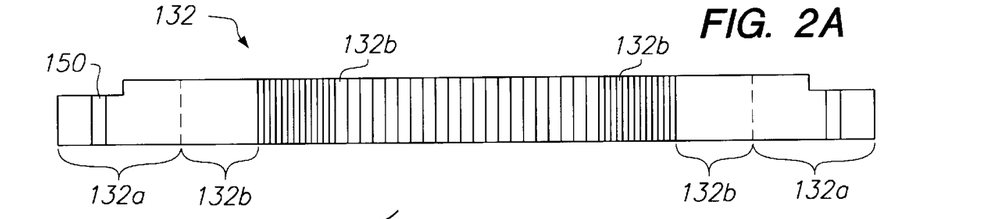
FIGS. 2A through 2C illustrate in more detail the baffle ring in accordance with one embodiment of the present invention.
Figure 2B:
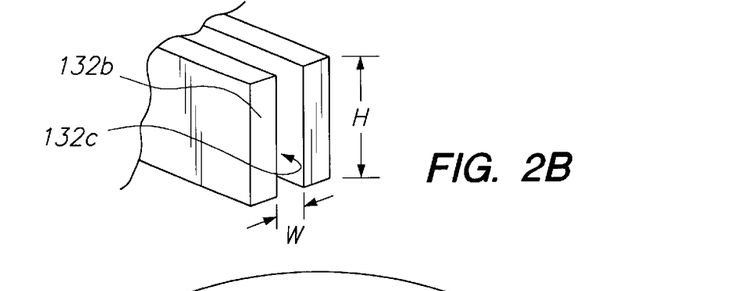
Figure 2C:
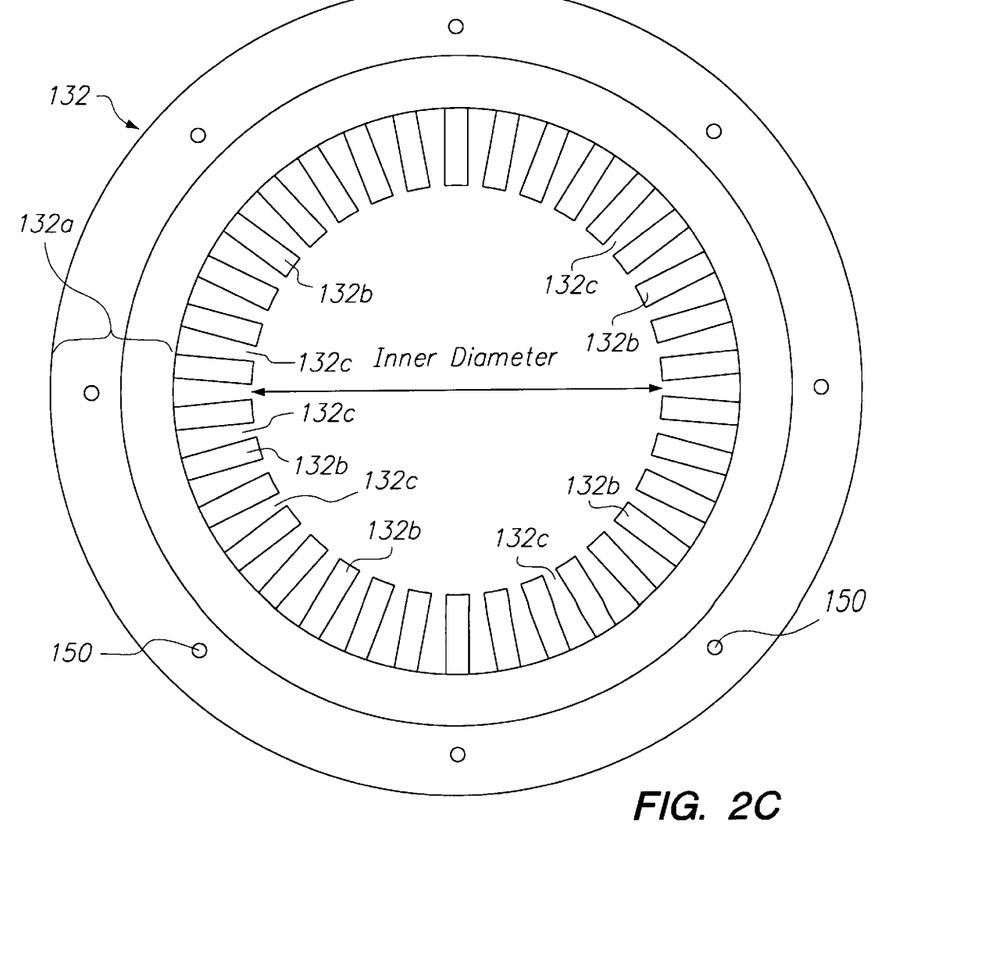

FIGS. 2A through 2C illustrate in more detail the baffle ring 132 in accordance with one embodiment of the present invention. As shown in FIG. 1, the baffle ring 132 functions as a plasma screen for the passage of gases and by-products to a vacuum pump connected at the bottom of the chamber 102. As shown, the baffle ring 132 has an array of teeth 132*b* that assist in maintaining the plasma in the top half of the chamber 102, where the silicon carbide surfaces (of the consumables) confine the plasma substantially over the wafer 104. The baffle ring 132 also has an inner ring 132*a* which is used to make good thermal contact with the chamber liner 130.

FIG. 2B is a three-dimensional view of a pair of teeth 132*b*. Generally, the open areas provided by the spaces 132*c* are configured such that a percentage ranging between 50 and 70 percent open area is maintained to allow a sufficient passageway for the gases and by-products to be pumped out of the chamber 102. To make each of the spaces 132*c*, as shown in FIG. 2C, the solid silicon carbide material (or coated SiC material) must be machined such that a suitable aspect ratio that is at least 1.5 or greater, is maintained. In this exemplary configuration, the width of the spaces 132*c* are preferably set to about 0.13 inch, and the height is set to about 0.28 inch. These preferred dimensions therefore provide an aspect ratio of about 2.0.

The inner diameter (ID) of the baffle ring 132, in this 200 mm wafer chamber embodiment, is set to about 10.75 inches, such that about 1/16 inch clearance is provided between the pedestal 112 shown in FIG. 1. However, the inner diameter (ID) may of course be larger, depending upon the size of the wafer being processed. For example, for a 300 mm wafer, the inner diameter may be as large as about 14 inches.

In alternative embodiments, the baffle ring 132 may be manufactured such that the teeth 132*b* are replaced with an array of holes or slots. When an array of holes or slots are manufactured in place of the teeth 132*b*, it is still desired to maintain an open area (i.e., pathway), that amounts to between about 50 percent and 70 percent. The baffle ring 132 is also shown having a plurality of screw holes 150 which are designed around the outer ring 132*a*. As shown in FIG. 1, the screw holes 150 will be configured to receive a suitable screw that will help interconnect the baffle ring 132 to the chamber liner 130 and the liner support 134. Other fasteners such as clamps could be envisioned that would supply the necessary contact force to permit sufficient transfers.

Figure 3A:
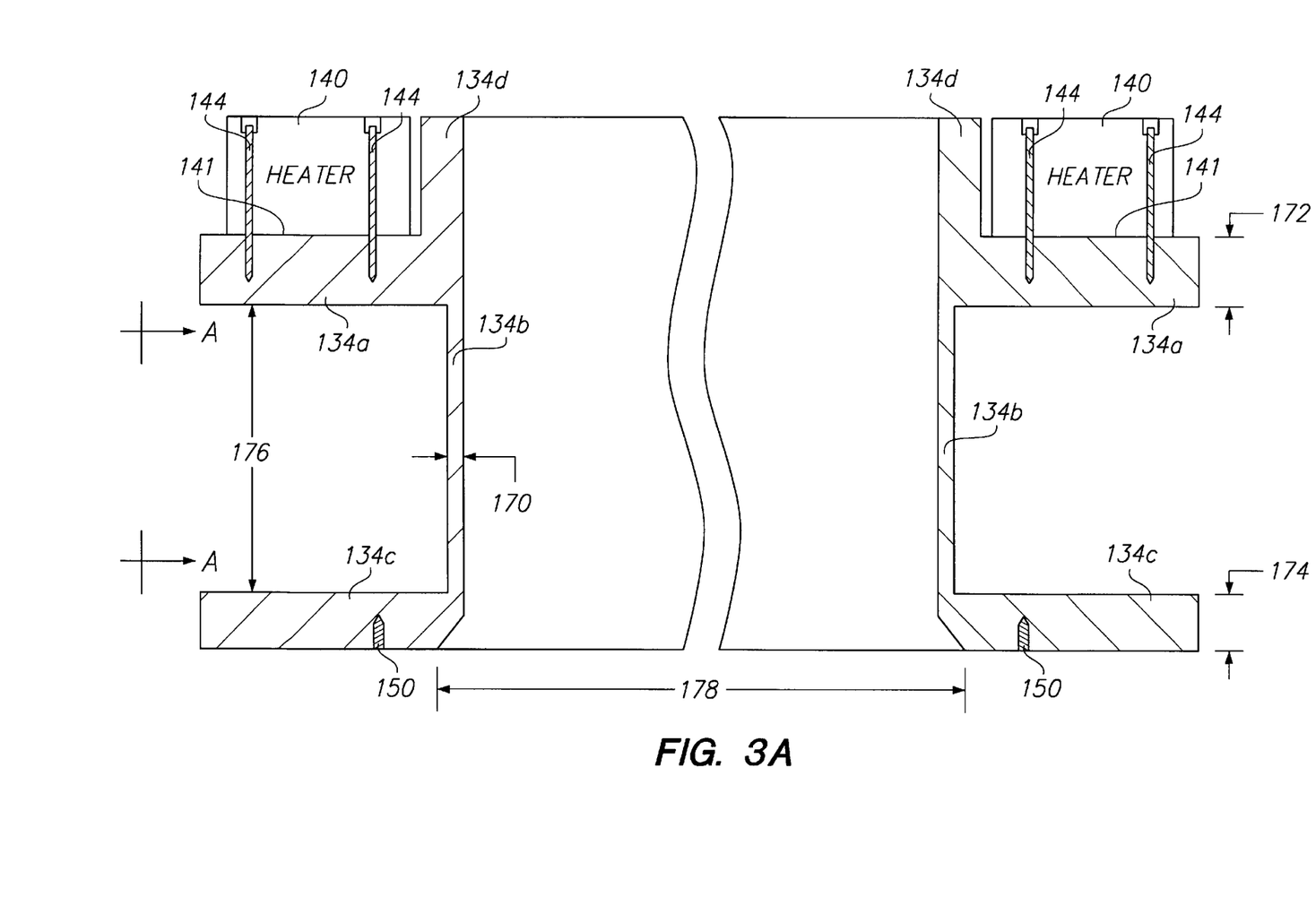
FIG. 3A shows a more detailed cross-sectional diagram of the liner support in accordance with one embodiment of the present invention.

FIG. 3A shows a more detailed cross-sectional diagram of the liner support 134 in accordance with one embodiment of the present invention. As mentioned above, the liner support 134 has a flexible wall 134*b* which is configured to flex in response to heat deformation that may occur when the heater 140 applies the desired heat level. Preferably, the flexible wall 134*b* is cylindrical and is slotted into a plurality of fingers. As mentioned above, the liner support is preferably made of an aluminum material which will have good thermal conductivity and will also provide good flexibility when a desired temperature is applied by the heater 140. Because the lower extension 134*c* is bolted down to the chamber liner 130 and the baffle ring 132, the lower extension 134*c* will remain in place while the upper extension 134*a*, which is coupled to the heater 140 at a heat-conductive interface 141, may be able to flex outwardly as illustrated in FIG. 3C.

The heater 140 is preferably secured to the upper extension 134*a* using a suitable number of screws 144 to ensure that the heat conductive interface 141 is maintained all the way around the upper extension 134*a*. In a preferred embodiment, the screws 144 will be capable of maintaining the heater 140 in contact with the upper extension 134*a* with a pressure of about 1,000 PSI.

When the high-density plasma etching chamber 100 is configured to process an 8-inch wafer (i.e., 200 mm wafer), the liner support 134 may have an inner diameter of about 14½ inches. The thickness 170 of the flexible wall 134*b* may range between about 1/16 inch and about 3/32 inch. The 1/16 inch dimension is preferably used for processing temperatures ranging up to about 300° C., while the 3/32 dimension is reserved for chambers having processing temperatures up to about 100°C.

The separation 176 between the lower extension 134*c* and the upper extension 134*a* is preferably set to about 2½ inches, depending upon the chamber height. However, the greater the separation 176 is, the greater the thermal resistance in the liner support 134. Therefore, the separation 176 is kept just short enough such that the aluminum material of the liner support will not become too stressed as temperatures reach 300° C. and above. The exemplary thickness 172 for the upper extension 134a is preferably set to about 9/16 inch, while the exemplary thickness of the lower extension 134c is set to about 5/8 inch.

Figure 3B:
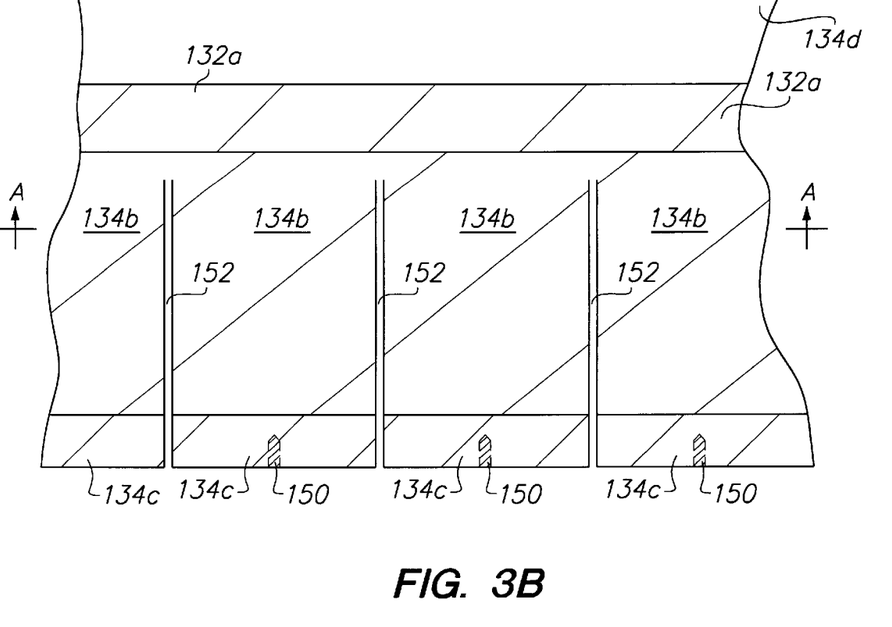
FIG. 3B shows a side view of the liner support from cross section A—A of FIG. 3A, in accordance with one embodiment of the present invention.
Figure 3C:
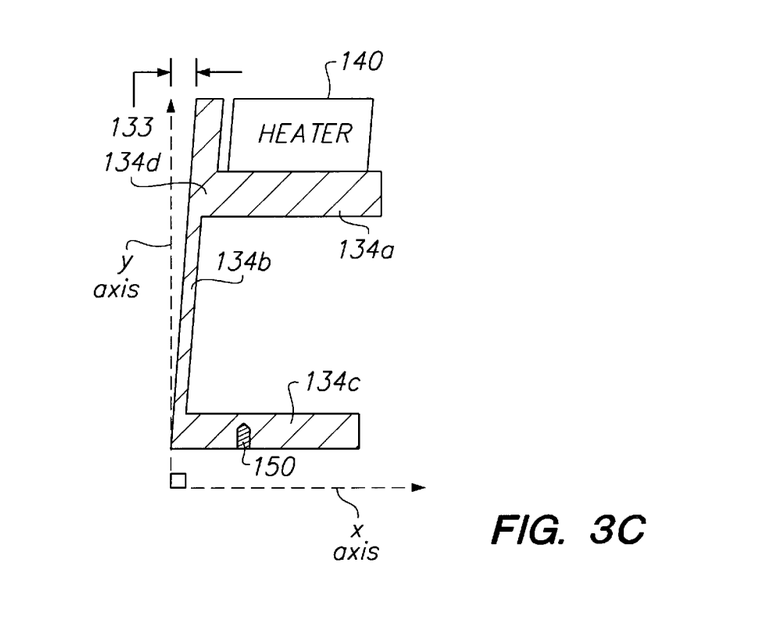
FIG. 3C illustrates the flexibility of the liner support when subjected to temperature stresses in accordance with one embodiment of the present invention.

FIG. 3B shows a side view of the liner support 134 from cross section A—A of FIG. 3A, in accordance with one embodiment of the present invention. To facilitate the flexibility of the liner support 134, slots 152 are defined into the sides of the liner support 134 defining a plurality of fingers. The slots 152 vertically extend through the flexible wall 134b and through the lower extension 134c. Because the liner support 134 is preferably a cylindrically shaped unit, the separation between the slots 152 must be configured such that a suitable level of flexibility remains in the flexible wall 134b. Therefore, the separation between slots 152 is preferably set to about 15 degrees. However, the actual separation between the slots 152 may vary and also change depending upon the diameter of the liner support 134 and the degree of flexibility that is desired. Also shown, are the screw holes 150 which are defined in the lower extensions 134c.

To illustrate the flexibility provided by the liner support 134, FIG. 3C shows the liner support extending outwardly from a Y axis (relative to a horizontal X-axis) to achieve a separation 133. In certain cases, the separation may be as much as 1/16 inch, or more. Accordingly, the liner support 134 will advantageously be able to withstand the thermal stress placed on the aluminum material of the liner support 134, while insulating the less flexible chamber liner 130 and the baffle ring 132 from temperature deforming stresses.

Figure 4:
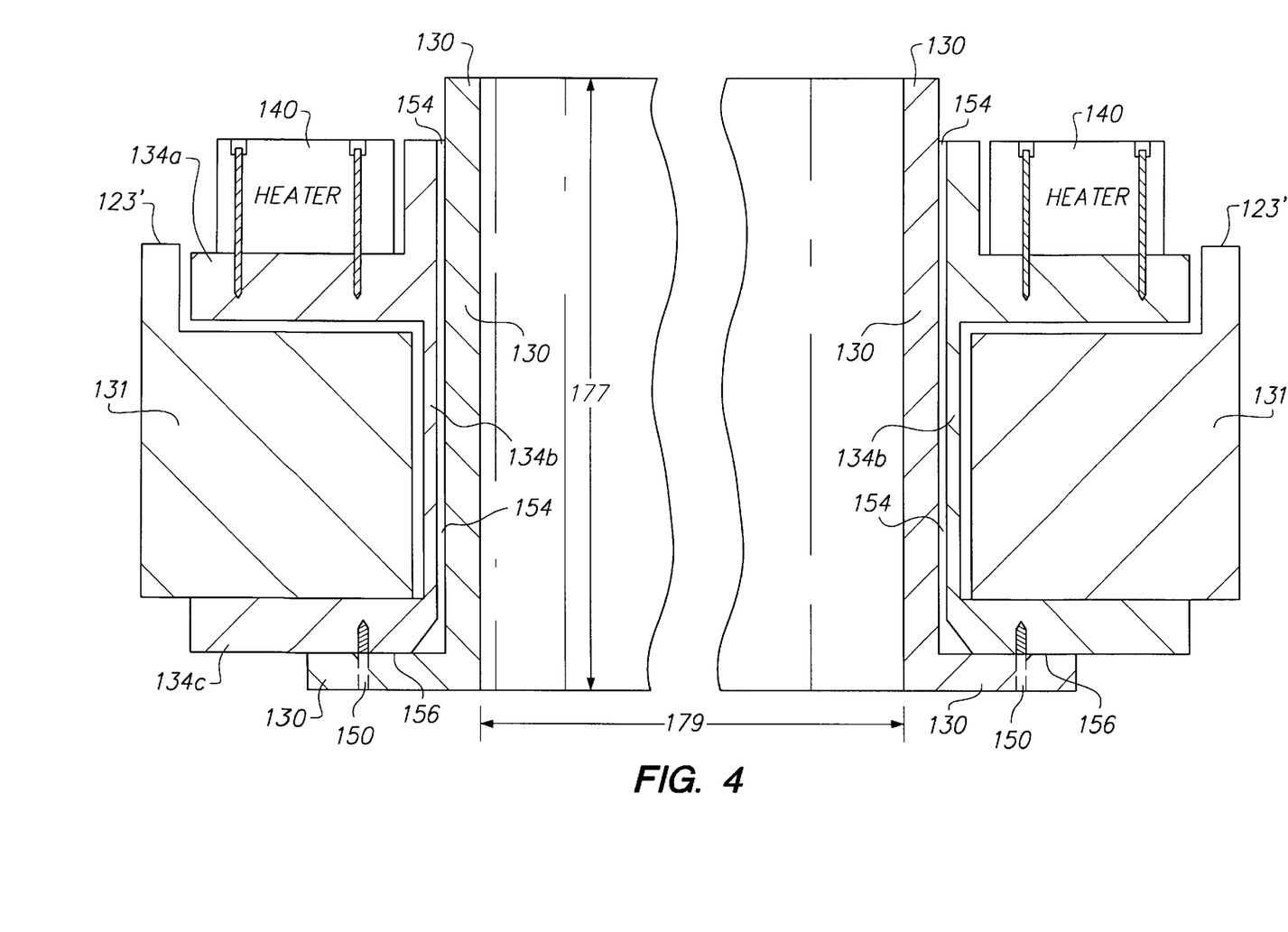
FIG. 4 illustrates how the chamber liner is assembled with the liner support in accordance with one embodiment of the present invention.

FIG. 4 illustrates how the chamber liner 130 is assembled with the liner support 134 in accordance with one embodiment of the present invention. In this embodiment, when the chamber liner is made of silicon carbide, it will provide a high integrity RF return path to ground for the powered electrode 108 (bottom electrode). As is well known to those skilled in the art, providing a high integrity RF ground path in the processing chamber brings the advantage of having excellent process repeatability. Further, the grounded SiC can reduce sputtering of other surfaces in the chamber by causing a reduction in the plasma potential and hence ion bombardment energy on any non-silicon carbide surfaces.

Additionally, the materials used for the chamber liner 130, such as SiC, can have their electrical resistivity modified over a wide range. For example, the resistivity of SiC can be tailored for the specific application. When used for the chamber liner 130 and the baffle plate 132, the SiC is modified to provide a low resistivity that will facilitate the good conductive path to ground for the RF power. On the other hand, high resistivity is needed when the part must have RF power inductively coupled through it, in order to minimize power dissipation in the part. Thus, high resistivity SiC is preferably used for the gas distribution plate (GDP) 120.

As shown, the screw holes 150 are configured to go through the chamber liner 130 at a lower support section and then go into the liner support 134. Generally, a suitable number of screws are used to interconnect the chamber liner 130 and the liner support 134 such that a good thermal conductive interface 156 is maintained. In this manner, the heat conducted through the liner support 134 may be thermally communicated to the chamber liner 130 and the baffle ring 132.

In this preferred embodiment, the liner support 134 is preferably spaced apart from the chamber liner 130 by a space 154. The space 154 is preferably set to about 1/16 inch. This separation is generally desired because the liner support 134 is configured to flex as described with reference to FIG. 3C. For a 200 mm wafer chamber, a diameter 179 of the chamber liner 130 is about 14 inches. The thickness of the chamber liner 130 is preferably set, in this embodiment, to be between about 0.1 inch and about 0.3 inch, and most preferably, to about 0.2 inch. The height 177 of this exemplary chamber liner may be between about 3 inches and about 12 inches, and most preferably about 5 inches.

Also shown is the outer support 131, which is thermally connected to the lower extension 134c of the liner support 134. Preferably, the outer support is spaced apart from the flexible wall 134b so that it can flex without substantial obstruction. The outer side of the outer support 131 has an upper extending wall having a surface 123', which is configured to make good thermal contact with the top plate 124. In this manner, a cooling ring 121, shown in more detail in FIG. 5A, can be used to control the temperature of the chamber liner 130 and the internal regions of the chamber. Accordingly, through the combined simultaneous control of both the heater 140 and cooling ring 121, the temperature of the chamber liner 130 can be maintained to within less than +/−10 degrees C from a no plasma condition through a sustained plasma on condition. Thus, the first wafer etched can be etched with the same chamber liner 130 temperature as the last wafer etched, to within the +/− 10 degrees C. variation.

Figure 5A:
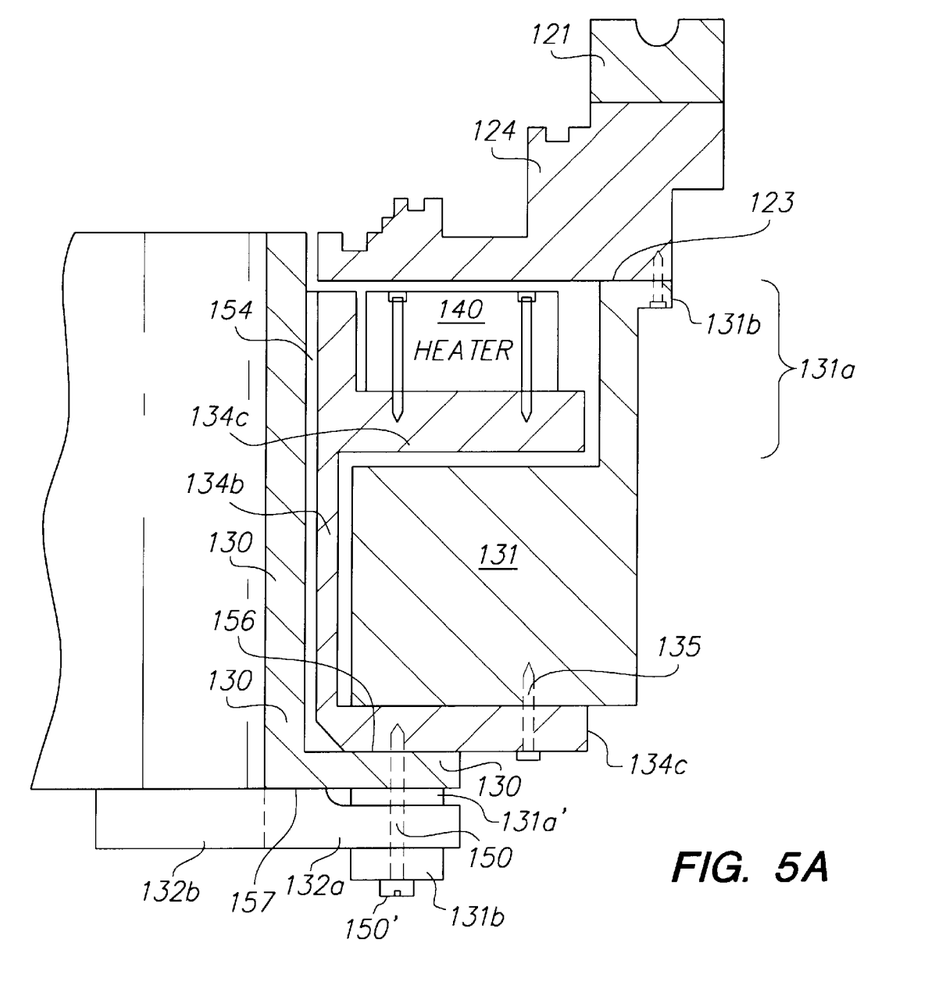
FIG. 5A shows a partial cross-sectional view of the chamber liner, the liner support, and the baffle ring, assembled in accordance with one embodiment of the present invention.
Figure 5B:
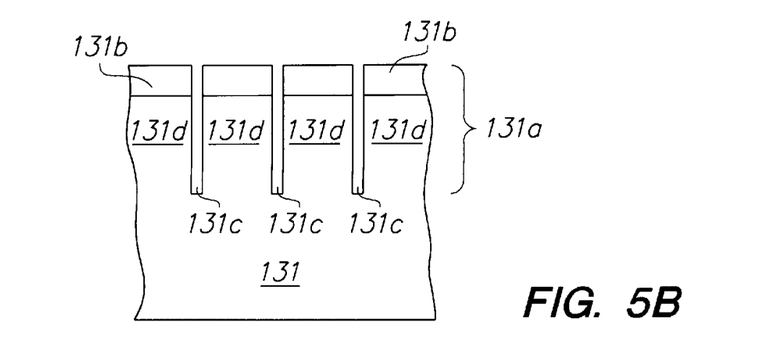
FIG. 5B shows a side view of an outer support in accordance with one embodiment of the present invention.

FIG 5A shows a partial cross-sectional view of the chamber liner 130, the liner support 134, and the baffle ring 132 assembled in accordance with one embodiment of the present invention. As shown, the chamber liner 130 and the liner support 134 are assembled to achieve a good thermal conductive interface 156 as described above.

As mentioned above, the outer support 131 is thermally connected to the lower extension 134c through a plurality of screws 135. The outer support 131, in a most preferred embodiment, has a flexible wall 131a, which is shown to be thermally connected to the top plate 124. A side view of the outer support 131 is also provided in FIG. 5B, to illustrate how a plurality of fingers 131d, separated by a plurality of slots 131c, assist in providing the necessary flexibility to the flexible wall 131a. The top plate 124 is further configured to receive the cooling ring 121 on a top lip of the top plate 124. Of course, other configurations for applying the cooling ring 121, or other type of cooling system, to the top plate 124 may be used.

In this embodiment, the combined use of the heater 140 and the cooling ring 121 will enable precision temperature control in narrow temperature ranges. For example, the chamber liner 130 is typically run at high temperatures, such as 200 degrees C. or more, while heat is lost to the surroundings primarily through radiation. When plasma is initiated, the plasma dumps more heat into the chamber liner 130 by ion bombardment. The chamber liner 130 will slowly increase in temperature over time because it generally cannot transfer this heat to its surroundings by radiation as fast as it gains heat from the plasma. Thus, the outer support 131, which is thermally coupled to the cooling ring 121, is well suited to eliminate the chamber liner's temperature drift. In this embodiment, the heat loss to the outer support 131 from the liner support 134 can be set by adjusting the cross-section and length of the outer support 131. This adjustment, can therefore be made to control the heat loss path from the liner support 134 to the temperature controlled top plate 124.

As shown, the chamber liner 130 will also provide a good thermal conductive interface 157 with the baffle ring 132. To achieve this good conductive interface, the baffle ring 132, the chamber liner 130, and the liner support 134 are secured together using a plurality of screws 150'. Preferably, the screws 150' are fitted through a spacer ring 131b which is in direct contact with the inner ring 132a of the baffle ring 132, a spacer 131a, and the chamber liner 130.

The spacer ring 131b and the spacer 131 are preferably made of aluminum and provide a good surface for applying pressure to the screws 150' and the brittle surfaces of the baffle ring 132 and the chamber liner 130. That is, because the baffle ring 132 is preferably a ceramic, applying too greater of a force with screws directly to the baffle ring may cause a crack in the baffle ring or the chamber liner 130. Once the screws 150' are secured all the way around the chamber, the chamber liner, the baffle ring and the liner support (i.e., the consumable parts) will be ready for use in the high density plasma etching chamber 100 of FIG. 1. As used herein, these parts are referred to as consumable parts, however, when silicon carbide (or other alternative materials described herein) is used for the parts that confine the high density plasma, these parts will have a longer lifetime, and therefore, a lower cost of consumables.

When replacement is needed, these parts may be swiftly replaced with replacement parts (i.e., using a quick clean kit). Because the liner support 134 is not designed to be in contact with the high density plasma, it may not wear out as fast as the chamber liner 130 and the baffle ring 132. Thus, the liner support 134 may be removed from worn out consumable parts (that may be cleaned off-line and re-used or discarded), and then used with the replacement consumable parts. When the chamber is being used in fabrication where chamber down time translates into lower yields, the ability to quickly replace these consumables will have the benefit of reducing the mean time to clean the chamber.

Figure 6:
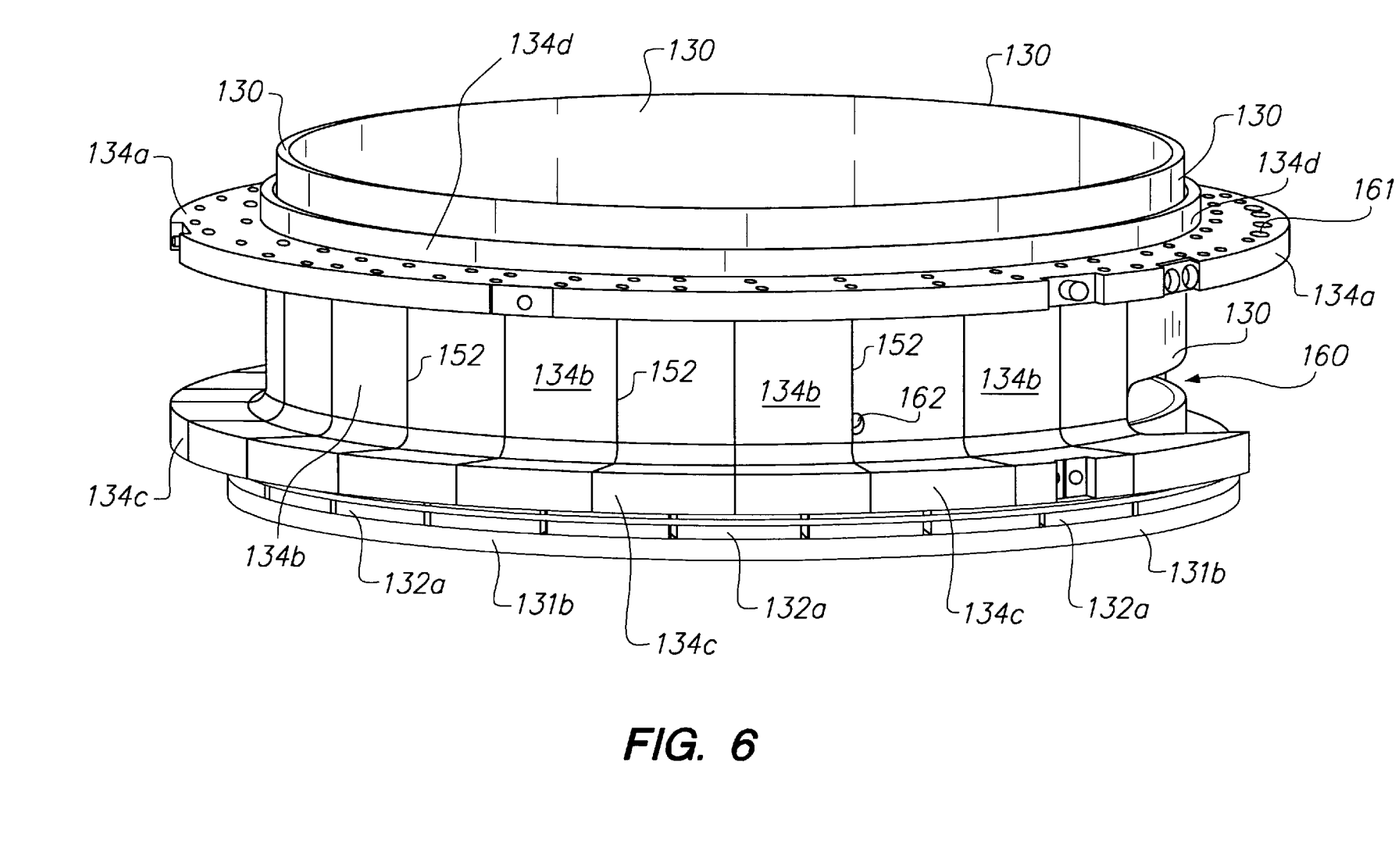
FIG. 6 illustrates a three-dimensional assembled view of the chamber liner, the baffle ring, and the liner support, in accordance with one embodiment of the present invention.

FIG. 6 illustrates a three-dimensional assembled view of the chamber liner 130, the baffle ring 132, and the liner support 134, in accordance with one embodiment of the present invention. As shown, the top surface of the upper extension 134a of the liner support 134, is configured with a plurality of screw holes that will receive the heater 140. Along the walls of the liner support 134 are the plurality of slots 152 that define fingers configured to flex in response to temperature variations. A port hole 160 is defined in the wall of the chamber liner 130 to enable the passage of a wafer into and out of the chamber 100. Typically, the wafer is preferably passed into the chamber using a robot arm which must partially fit into the port 160, and release the wafer once over the electrostatic chuck 106. Therefore, the port 160 should be large enough to receive the wafer and robot arm, but also maintained small enough to not disrupt the plasma profile over the wafer.

The liner support 134 typically also includes through holes 162 which are also defined in the chamber liner 130. The through holes 162 may include holes for probing the pressure within the chamber during processing, and for optically detecting the endpoint in a particular process. Also shown with greater detail are plurality of holes 161 which are used to receive the screws 144 for holding down the heater 140 to the upper extension 134a of the liner support 134.

Figure 7:
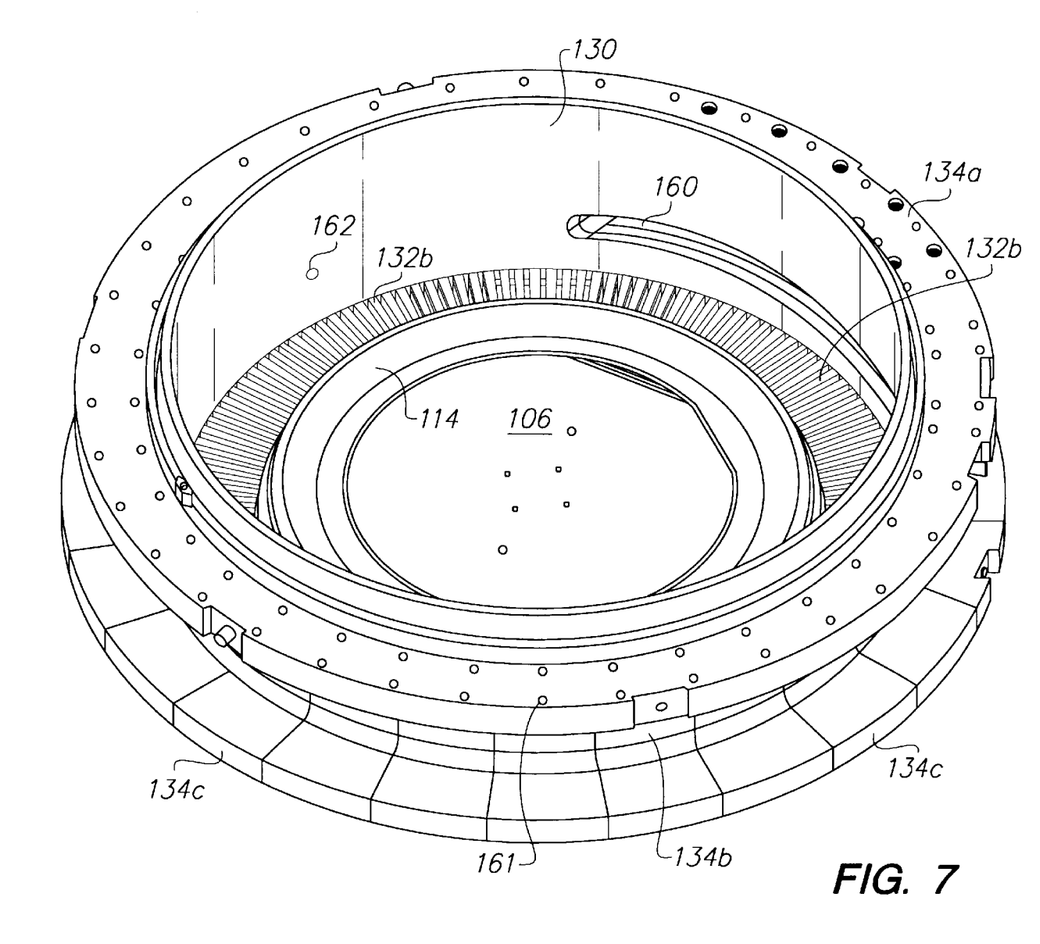
FIG. 7 shows another three-dimensional view of the assembled chamber liner, liner support, and the baffle ring, in accordance with one embodiment of the present invention.

FIG. 7 shows another three-dimensional view of the assembled chamber liner 130, liner support 134, and the baffle ring 132. From this view, the port hole 160 used for passing a wafer to the electrostatic chuck 106, is shown in greater detail. Also shown are the teeth 132b of the baffle ring 132. The teeth 132b therefore extend in close proximity to the pedestal 112 to screen the plasma from the lower part of the chamber as shown in FIG. 1.

Figure 8:
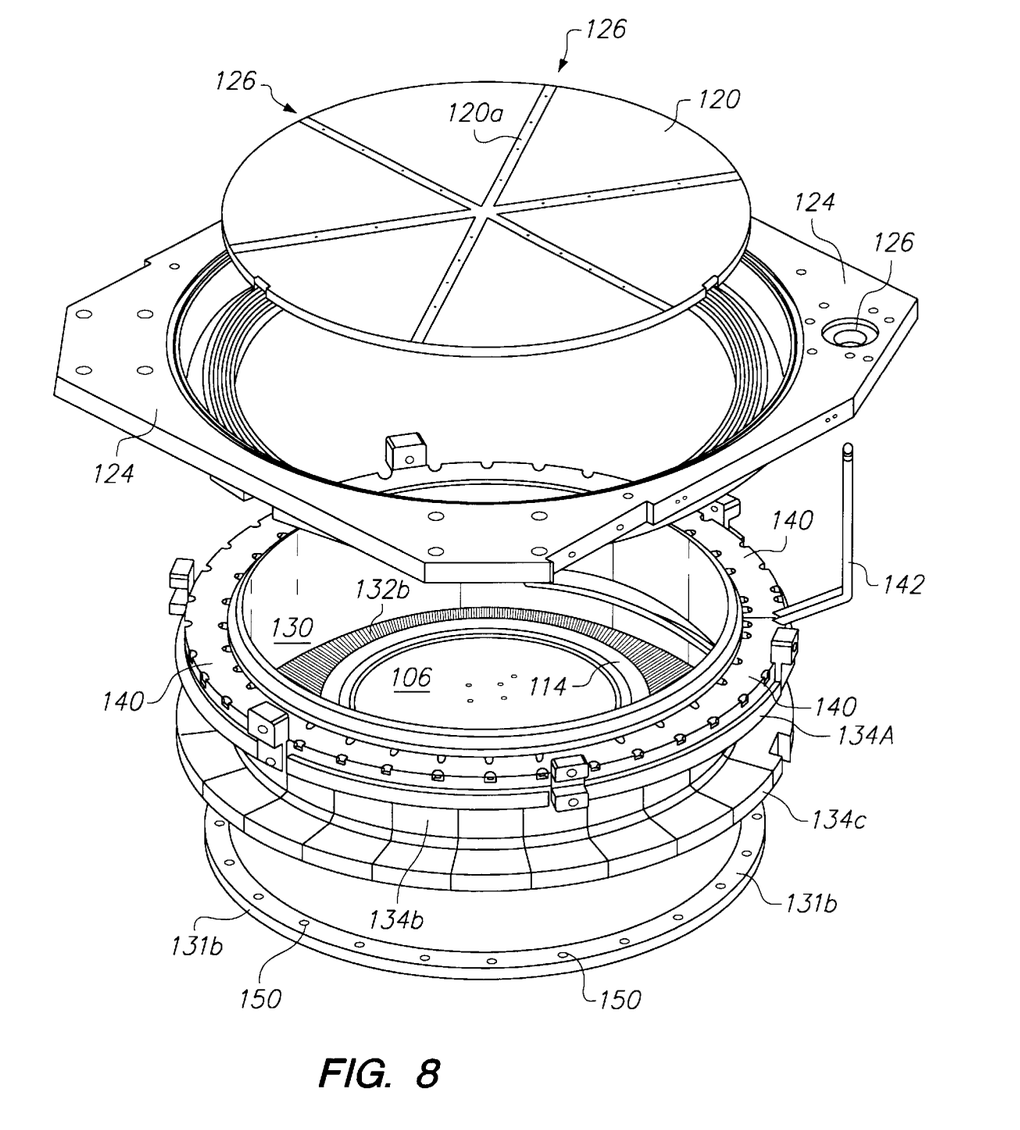
FIG. 8 shows an exploded view of portions of the high-density plasma etching chamber of FIG. 1 in accordance with one embodiment of the present invention.

FIG. 8 shows an exploded view of portions of the high-density plasma etching chamber 100 of FIG. 1 in accordance with one embodiment of the present invention. This view shows the spacer ring 131b that is used in the assembly of the baffle ring 132, the chamber liner 130, and the liner support 134. This perspective also illustrates how the heater 140 is applied over the top extension 134a of the liner support 134. The heater 140, as shown, is preferably a cast heater. Of course, other types of heating systems may also work. When the heater 104 is appropriately secured, a good thermal contact will be made with the liner support 134.

The power connection 142 is also shown, which will be passed through a hole 124a in the top plate 124. The top plate 124 is shown capable of receiving the gas distribution plate 120. The gas distribution plate 120 has channels 120a which enable processing gases fed by gas feed ports 126 to be directed into the chamber 100. Although not shown in this example, the ceramic window 122 may then be lowered over the gas distribution plate 120.

In a preferred embodiment of the present invention, the high density plasma etch chamber 100 is particularly well suited to etch silicon oxide materials, such as, for example, thermally grown silicon dioxide ($SiO_2$), TEOS, PSG, BPSG, USG (undoped spin-on-glass), LTO, etc., while reducing the introduction of unwanted contaminants. For exemplary purposes only, to achieve the high density plasma conditions in the chamber 100, the pressure within the chamber is preferably maintained below about 80 mTorr, and the RF coil 128 (i.e., top electrode) is preferably set to between about 2500 watts and about 400 watts, and most preferably to about 1,500 watts. The bottom electrode 108 is preferably maintained between about 2500 watts and about 700 watts, and most preferably at about 1,000 watts. In typical high density oxide etch processes, process gases such as, $CHF_3$, $C_2HF_5$ and/or $C_2F_6$ are introduced into the chamber to generate the desired etching characteristics.

As mentioned previously, the materials that can be used for the plasma confining parts (e.g., the consumables, including the chamber liner 130, the baffle ring 132, the GDP 120, the focus ring 114, and the pedestal 112) are generally innocuous to layers being fabricated on the wafer 104. That is, volatile etch products that result from etching the surfaces of the wafer 104 will be similar to the volatile products produced when the consumables are bombarded (i.e., sputtered) with the plasma energies. As an advantageous result, these the volatile products produced from ion bombardment of the consumables will join the normal volatile etch products.

This therefore facilitates the removal of these combined volatile products from the internal region of the chamber 100 through the use of a vacuum pump that connects to the chamber. Due to the fact that the volatile products from the consumables are able to be expeditiously removed from the wafer processing region, substantially fewer levels of particulates and metallic contaminants will interfere with the devices being fabricated on the surface of the wafer 104. While this invention has been described in terms of several preferred embodiments, it will be appreciated that those skilled in the art upon reading the preceding specifications and studying the drawings will realize various alterations, additions, permutations and equivalents thereof. Therefore, although specific details are provided with respect to reducing contamination for semiconductor wafers, such benefits may also apply to flat panel display substrates, and the like. Furthermore, although a preferred material for the consumable parts is pure silicon carbide (SiC), the material may also be a SiC coated material such as SiC coated graphite, or principally SiC with 10 to 20% Si added to fill porosity in reaction bonded SiC. As also mentioned previously, the consumable parts may also be made from materials such as, silicon nitride ($Si_3N_4$), boron carbide ($B_4C$), and boron nitride (BN). These materials all have the desirable characteristics of having high etch resistance, non-contaminating elements, and volatile etch products.

It is therefore intended that the present invention include all such alterations, additions, permutations, and equivalents as fall within the true spirit and scope of the invention.

What is claimed is:

1. A plasma processing chamber having an electrostatic chuck for holding a wafer, the plasma processing chamber having consumable parts, comprising:
    a chamber liner having a lower support section and a wall that is configured to surround the electrostatic chuck; and
    a liner support structure having a lower extension, a flexible wall, and an upper extension, the flexible wall being configured to surround an external surface of the wall of the chamber liner, the flexible wall being spaced apart from the wall of the chamber liner, but the lower extension of the liner support being in direct thermal contact with the lower support section of the chamber liner.

2. A plasma processing chamber having an electrostatic chuck for holding a wafer, the plasma processing chamber having consumable parts as recited in claim 1, further comprising:
    a heater being thermally connected to the upper extension of the liner support for thermally conducting a temperature from the liner support to the chamber liner.

3. A plasma processing chamber having an electrostatic chuck for holding a wafer, the plasma processing chamber having consumable parts as recited in claim 2, wherein the liner support is made from a flexible aluminum material.

4. A plasma processing chamber having an electrostatic chuck for holding a wafer, the plasma processing chamber having consumable parts as recited in claim 3, wherein the flexible wall has a plurality of fingers to enable the flexible wall to absorb a stress imposed by the temperature.

5. A plasma processing chamber having an electrostatic chuck for holding a wafer, the plasma processing chamber having consumable parts as recited in claim 4, wherein the lower extension of the liner support is maintained fixed to the lower support section of the chamber liner while the upper extension of the liner support is capable of flexing outwardly from a center of the wall of the chamber liner, while relieving stress on the chamber liner.

6. A plasma processing chamber having an electrostatic chuck for holding a wafer, the plasma processing chamber having consumable parts as recited in claim 1, further comprising:
    a baffle ring being configured to be assembled with and in thermal contact with the chamber liner and the liner support, the baffle ring defining a plasma screen around the electrostatic chuck.

7. A plasma processing chamber having an electrostatic chuck for holding a wafer, the plasma processing chamber having consumable parts as recited in claim 6, wherein the baffle ring is made from materials consisting of one or more of:
    silicon carbide (SiC), silicon nitride ($Si_3N_4$), boron carbide ($B_4C$), and boron nitride (BN).

8. A plasma processing chamber having an electrostatic chuck for holding a wafer, the plasma processing chamber having consumable parts as recited in claim 1, wherein the chamber liner is made from materials consisting of one or more of:
    silicon carbide (SiC), silicon nitride ($Si_3N_4$), boron carbide ($B_4C$), and boron nitride (BN).

9. A plasma processing chamber having an electrostatic chuck for holding a wafer, the plasma processing chamber having consumable parts as recited in claim 1, wherein the chamber liner has a low resistivity and is configured to provide an RF path to ground.

10. A plasma processing chamber having an electrostatic chuck for holding a wafer, the plasma processing chamber having consumable parts as recited in claim 1, further comprising:
    a gas distribution plate defined over the electrostatic chuck, the gas distribution plate being configured to have a high resistivity.

11. A plasma processing chamber having an electrostatic chuck for holding a wafer, the plasma processing chamber having consumable parts as recited in claim 10, wherein the gas distribution plate is made from materials consisting of one or more of:
    silicon carbide (SiC), silicon nitride ($Si_3N_4$), boron carbide ($B_4C$), and boron nitride (BN).

12. A plasma processing chamber having an electrostatic chuck for holding a wafer, the plasma processing chamber having consumable parts as recited in claim 1, further comprising:
    a focus ring and a pedestal for holding the focus ring and electrostatic chuck.

13. A plasma processing chamber having an electrostatic chuck for holding a wafer, the plasma processing chamber having consumable parts as recited in claim 12, wherein the focus ring and the pedestal is made from materials consisting of one or more of:
    silicon carbide (SiC), silicon nitride ($Si_3N_4$), boron carbide ($B_4C$), and boron nitride (BN).

14. A plasma processing chamber having an electrostatic chuck for holding a wafer, the plasma processing chamber having consumable parts as recited in claim 1, wherein the consumable parts include the chamber liner, the liner support, a baffle ring, a focus ring, a pedestal, and a gas distribution plate, the consumable parts are made form materials consisting of one or more of:
    silicon carbide (SiC), silicon nitride ($Si_3N_4$), boron carbide ($B_4C$), and boron nitride (BN).

15. A plasma processing chamber having an electrostatic chuck for holding a wafer, the plasma processing chamber having consumable parts as recited in claim 14, wherein the wafer has a layer of oxide that is configured to be etched under a high density plasma etch process.

16. A plasma processing chamber having an electrostatic chuck for holding a wafer, the plasma processing chamber having consumable parts as recited in claim 1, further comprising:
    an outer support being thermally connected to the lower extension of the liner support structure;
    a top plate configured to mount over the plasma processing chamber, the outer support being in thermal contact with the top plate.

17. A plasma processing chamber having an electrostatic chuck for holding a wafer, the plasma processing chamber having consumable parts as recited in claim 16, further comprising:

a cooling ring being in thermal contact with the top plate, such that the cooling ring is connected by a thermal path to the liner support structure and the chamber liner.

18. A plasma processing chamber having an electrostatic chuck for holding a wafer, the plasma processing chamber having consumable parts as recited in claim 17, wherein the cooling ring is configured to prevent the chamber liner from drifting upwards in a temperature during plasma processing.

19. A plasma etching chamber, comprising:
a chamber liner having a lower support section and a cylindrical wall that surrounds a center of the plasma etching chamber;
a liner support being configured to surround the chamber liner, the liner support is spaced apart from the cylindrical wall of the chamber liner and is thermally connected to the lower support section of the chamber liner, the liner support further includes a plurality of slots that divide the liner support into a plurality of fingers.

20. A plasma etching chamber as recited in claim 19, wherein the chamber liner is made from a material including one of a silicon carbide (SiC) material, a silicon nitride ($Si_3N_4$) material, a boron carbide ($B_4C$) material, and a boron nitride (BN) material, and the liner support is made from an aluminum material.

21. A plasma etching chamber as recited in claim 19, wherein the liner support further includes:
an upper extension;
a flexible wall; and
a lower extension;
wherein the flexible wall and the lower extension have the plurality of slots that define the plurality of fingers in the liner support.

22. A plasma etching chamber as recited in claim 21, wherein the upper extension is configured to receive a cast heater ring, such that the cast heater ring is thermal contact with the liner support, and the liner support is capable of thermally conducting a temperature to the chamber liner.

23. A plasma etching chamber as recited in claim 22, wherein the upper extension of the liner support is configured to expand away from the chamber liner when exposed to a sufficient level of the temperature by the cast heater ring.

24. A plasma etching chamber as recited in claim 19, further comprising:
a baffle ring being made from a material including one of a silicon carbide (SiC) material, a silicon nitride ($Si_3N_4$) material, a boron carbide ($B_4C$) material, and a boron nitride (BN) material, and the baffle ring is thermally connected to the lower extension of the liner support and the lower support section of the chamber liner.

25. A plasma etching chamber as recited in claim 21, further comprising:
an outer support being thermally connected to the lower extension of the liner support structure;
a top plate configured to mount over the plasma etching chamber, the outer support being in thermal contact with the top plate.

26. A plasma etching chamber as recited in claim 25, further comprising:
a cooling structure being in thermal contact with the top plate, such that the cooling structure is connected by a thermal path to the liner support and the chamber liner.

27. A plasma etching chamber as recited in claim 26, wherein the cooling structure is configured to prevent the chamber liner from drifting upwards in a temperature during etching.

28. A plasma etching chamber as recited in claim 23, further comprising:
a gas distribution plate being made from a material including one of a silicon carbide (SiC) material, a silicon nitride ($Si_3N_4$) material, a boron carbide ($B_4C$) material, and a boron nitride (BN) material, and the material of the gas distribution plate is configured to be highly resistive.

29. A plasma etching chamber as recited in claim 20, wherein the chamber liner is configured to be grounded and have a low surface resistivity.

30. A plasma etching chamber as recited in claim 29, wherein the chamber liner provides an RF path to a ground potential.

31. A plasma etching chamber as recited in claim 20, wherein a wafer is configured to be contained at the center of the plasma etching chamber, and the wafer has a layer of oxide that is configured to be etched under a high density plasma etch process.

32. A plasma etching chamber as recited in claim 20, further comprising:
a baffle ring, a focus ring, a pedestal, and a gas distribution plate, each of which are made from a material including one of a silicon carbide (SiC) material, a silicon nitride ($Si_3N_4$) material, a boron carbide ($B_4C$) material, and a boron nitride (BN) material.

33. A method for making consumable parts for use in a high density plasma etching chamber, comprising:
generating a chamber liner from a material selected from one of a silicon carbide (SiC) material, a silicon nitride ($Si_3N_4$) material, a boron carbide ($B_4C$) material, and a boron nitride (BN) material, the chamber liner having a wall that surrounds a plasma region of the chamber and a lower support section;
generating an aluminum liner support, the liner support having a lower extension, a flexible wall and an upper extension;
machining a plurality of slots into the flexible wall and the lower extension of the liner support to enable the liner support to expand under elevated temperatures;
generating a baffle ring from the material selected from one of the silicon carbide (SiC) material, the silicon nitride ($Si_3N_4$) material, the boron carbide ($B_4C$) material, and the boron nitride (BN) material;
machining a plurality of slots into the baffle ring to define a plasma screen; and
connecting the chamber liner, the liner support and the baffle ring together at a thermal conduction interface, such that a thermal contact exists between the chamber liner, the liner support and baffle ring.

34. A method for making consumable parts for use in a high density plasma etching chamber as recited in claim 33, further comprising:
attaching a heater ring to the upper extension of the liner support;
wherein the heater ring is configured to conduct a temperature to the liner support and then transfer the temperature to the chamber liner and the baffle ring through the thermal conduction interface.

35. A method for making consumable parts for use in a high density plasma etching chamber as recited in claim 33, further comprising:
striking a plasma in the high density plasma etching chamber, the plasma is configured to come into contact with the chamber liner that will produce volatile products, the volatile products being substantially similar to a volatile etch produced when surfaces of a wafer being processed in the chamber is etched.

36. A method for making consumable parts for use in a high density plasma etching chamber as recited in claim 35, wherein the volatile products and the volatile etch products are vacuum removed from the chamber.

37. A method for making consumable parts for use in a high density plasma etching chamber as recited in claim 35, further comprising:

generating a baffle ring;

generating a focus ring;

generating a pedestal; and generating a gas distribution plate;

wherein each of which are made from a material including one of a silicon carbide (SiC) material, a silicon nitride ($Si_3N_4$) material, a boron carbide ($B_4C$) material, and a boron nitride (BN) material.

38. A method for making consumable parts for use in a high density plasma etching chamber as recited in claim 35, wherein the chamber liner provides a low resistive RF path to ground.

* * * * *